United States Patent [19]
Koifman et al.

[11] Patent Number: 5,748,030
[45] Date of Patent: May 5, 1998

[54] BIAS GENERATOR PROVIDING PROCESS AND TEMPERATURE INVARIANT MOSFET TRANSCONDUCTANCE

[75] Inventors: Vladimir Koifman, Rishon-Lezion; Yachin Afek, Kfar Saba; Israel Kashat, Netanya, all of Israel

[73] Assignee: Motorola, Inc., Schaumburg, Ill.

[21] Appl. No.: 699,283

[22] Filed: Aug. 19, 1996

[51] Int. Cl.$^6$ .................................. H03K 3/011
[52] U.S. Cl. .............................. 327/513; 327/543
[58] Field of Search .......................... 327/512, 513, 327/530, 538–546; 323/314–316

[56] References Cited

U.S. PATENT DOCUMENTS

| | | | |
|---|---|---|---|
| 4,723,108 | 2/1988 | Murphy et al. | 323/315 |
| 5,103,158 | 4/1992 | Cho et al. | 323/314 |
| 5,124,631 | 6/1992 | Terashima | 323/313 |
| 5,220,273 | 6/1993 | Mao | 323/313 |
| 5,359,552 | 10/1994 | Dhong et al. | 327/539 |
| 5,394,026 | 2/1995 | Yu et al. | 327/539 |
| 5,467,052 | 11/1995 | Tsukada | 327/513 |

FOREIGN PATENT DOCUMENTS

| | | | |
|---|---|---|---|
| 0544627 | 9/1992 | European Pat. Off. | H03F 3/45 |
| 3106558 | 1/1982 | Germany | G05F 1/00 |

*Primary Examiner*—Timothy P. Callahan
*Assistant Examiner*—My-Trang Nu Ton
*Attorney, Agent, or Firm*—Robert M. Handy

[57] ABSTRACT

The present invention describes a bias generator (10) which supplies a temperature stabilizing bias current (72) to a main circuit (90). The bias generator (10) comprises a measurement unit (20) having a similar structure and temperature characteristic as the main circuit (90). Measurement unit (20) supplies a temperature dependent measurement signal (27). A temperature invariant element (40) supplies a temperature independent reference signal (47). These signals (27, 47) are compared in a differential amplifier (30) which controls variable current sources (50, 60, 70). The variable current sources (50, 60) supply the measurement unit (20), the temperature invariant element (40) and the bias current (72) for the main circuit (90) itself. A negative feedback is produced which results in a stabilized transconductance of the main circuit (90). Therefore, the bias current (72) which determines all other currents and the speed of the main circuit (90) is automatically adjusted to the needs. Power consumption can be reduced and the reliability of the main circuit (90) can be improved.

12 Claims, 4 Drawing Sheets

5,748,030

1

BIAS GENERATOR PROVIDING PROCESS AND TEMPERATURE INVARIANT MOSFET TRANSCONDUCTANCE

FIELD OF THE INVENTION

The present invention relates to a circuit arrangement which provides bias current for other circuits, such as for monolithic integrated analog or digital circuits.

BACKGROUND OF THE INVENTION

Switched current filters, time-continuous filters, and other analog or digital circuits rely on the accuracy of current sources for correct operation. In turn, these current sources generally require stable transconductance values.

However, transconductance values are affected by a thermal drift. Therefore, temperature changes influence the performance of the circuit.

The speed of circuits depends among other things on resistors and capacities (R, C). For example, the speed is influenced by the delay time of inverters. In modern CMOS processes it is possible to achieve a ±5% accuracy for capacities. However, the R-values can fluctuate by factor 3 over the temperature band the circuit is used in. Therefore, it is very important to stabilize R or the reciprocal transconductance.

Temperature variations cause large variations in the speed and other performance criteria of field effect transistor (FET) circuits because it effects the transconductance of the FETs. Typically, the transconductance $G_m$ of a FET is inversely proportional to temperature, such that an increase in temperature will result in a decrease in transconductance. The effect of these variations, including the variations in temperature and manufacturing tolerances, must be minimized. This can be accomplished by altering the gate bias voltage of a transistor so that a voltage is modulated (up or down) when transconductance is altered by the effect of temperature. For example, when the transconductance is reduced under conditions of higher temperature, the gate bias voltage is increased to such a degree that the transconductance of the transistor is actually increased to reverse the effect of temperature on other transistors.

In a prior art approach a bias generator provides a bias current $I_{BIAS}$ proportional to the absolute temperature (PTAT) to a main circuit. The bias current $I_{BIAS}$ usually defines the power consumption of the main circuit. The value of $I_{BIAS}$ is chosen in order to provide the necessary operation speed of the analog circuit. The bias must be large enough to ensure operation even in the worst case of high temperatures and high speed.

In order to save power, there is the technical task to optimize $I_{BIAS}$ to obtain the necessary speed for every condition. There is a need to provide a bias generator which can neutralize the above mentioned thermal drift in the main circuit.

Examples of prior art approaches are described in U.S. Pat. Nos. 4,723,108- Murphy et al., 4,388,539- Boeke; and in European patent 544627-Zuffada.

SUMMARY OF THE INVENTION

The objects of the invention are solved basically by applying the features laid down in the independent claims. Further preferred embodiments of the invention are given in the dependent claims.

A bias generator according to the present invention is used for biasing an analog MOSFET circuits (main circuit). The

2 bias generator measures that transconductance and supplies only the required bias current to the main circuit. The other currents of the main circuit are derived from the bias current.

In comparison to prior art solutions, the bias generator optimizes the bias current. Therefore, power consumption of the main circuit can be significantly reduced and the stability of other parameters can be improved. The bias generator can be integrated into the same chip as the main circuit.

DETAILED DESCRIPTION OF THE DRAWINGS

Figure 1:
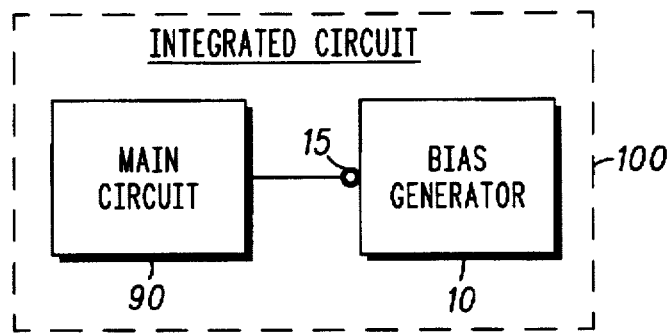
FIG. 1 shows a simplified schematic diagram of a monolithic integrated circuit comprising a main circuit which is stabilized by a bias generator according to the present invention.

FIG. 1 shows a simplified schematic diagram of a monolithic integrated circuit 100. It comprises a main circuit 90 which is stabilized by a bias generator 10 according to the present invention. Bias generator 10 is coupled to main circuit 90 via terminal 15. Bias generator 10 can be part of integrated circuit 100 as shown in the figure. It is also possible to locate bias generator 10 outside integrated circuit 100. A person skilled in the art will understand that there are many ways to couple bias generator 10 to one or more main circuits 90.

Bias generator 10 will be introduced by a first and a second preferred embodiment of the invention as bias generator 11 and 12. That means that the reference number 10 is applicable for both bias generator 11 and 12. In the following, bias generator 10 will be further explained in connection with FIG. 2 and FIG. 3. Bias generator 11 is similar to bias generator 10 and will be explained in connection with FIG. 4.

Figure 2:
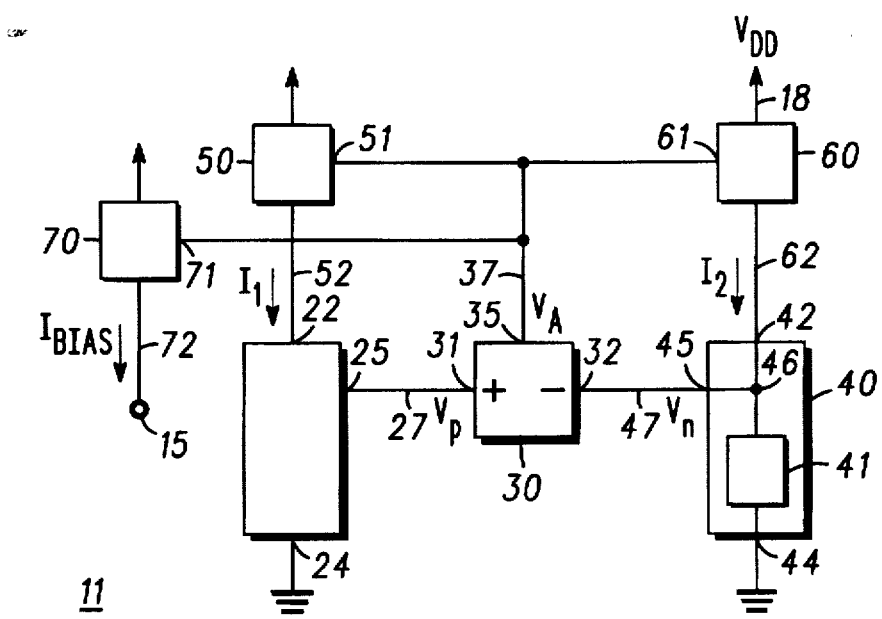
FIG. 2 shows a simplified schematic diagram of a bias generator according to a first preferred embodiment of the present invention.

FIG. 2 shows a simplified schematic diagram of bias generator 11 according to the first preferred embodiment of the present invention. Bias generator 11 comprises variable current sources 50, 60 ,70, measurement unit 20, temperature invariant element 40 (hereinafter element 40), differential amplifier 30, and terminal 15.

Variable current sources 50, 60, 70 are coupled to a power supply voltage $V_{DD}$ indicated by reference number 18. Variable current source 70 is coupled between power supply voltage $V_{DD}$ and terminal 15. Variable current source 50, 60, 70 generate auxiliary currents $I_1$, $I_2$, and bias current $I_{BIAS}$, respectively. In FIG. 2, the currents are indicated by reference numbers 52, 62, and 72, respectively.

Measurement unit 20 has output 24 coupled to a reference potential (e.g., ground) and input 22 coupled via variable current source 50 to $V_{DD}$. Measurement unit 20 has output 25 for providing measurement signal 27 ($V_p$).

Element 40 has output 44 coupled to the reference potential and input 42 coupled via variable current source 60 to $V_{DD}$. Element 40 comprises at least resistor 41 having the value $R_1$. Resistor 41 is coupled via node 46 between input 42 and output 44 of element 40. Element 40 can comprise components having a small temperature coefficient. Such components, e.g. resistor 41, can be independent from process fluctuations. It is possible to locate element 40 or its components outside integrated circuit 100. Element 40 has output 45 coupled to node 46 for providing a reference signal 47 ($V_n$).

Differential amplifier 30 has non-inverting input 31 coupled to output 25 of measurement unit 20. Inverting input 32 is coupled to output 45 of element 40. Output 35 is coupled to control inputs 51, 61, 71 of variable current sources 50, 60, 70 for supplying control signal 37 ($V_A$).

Measurement signal 27 is the input voltage $V_p$ of differential amplifier 30 at non-inverting input 31. Reference signal 47 is the voltage across resistor 41 which is the input voltage $V_n$ of differential amplifier 30 at inverting input 32. Control signal 37 is the output voltage $V_A$ of the differential amplifier 30.

Figure 3:
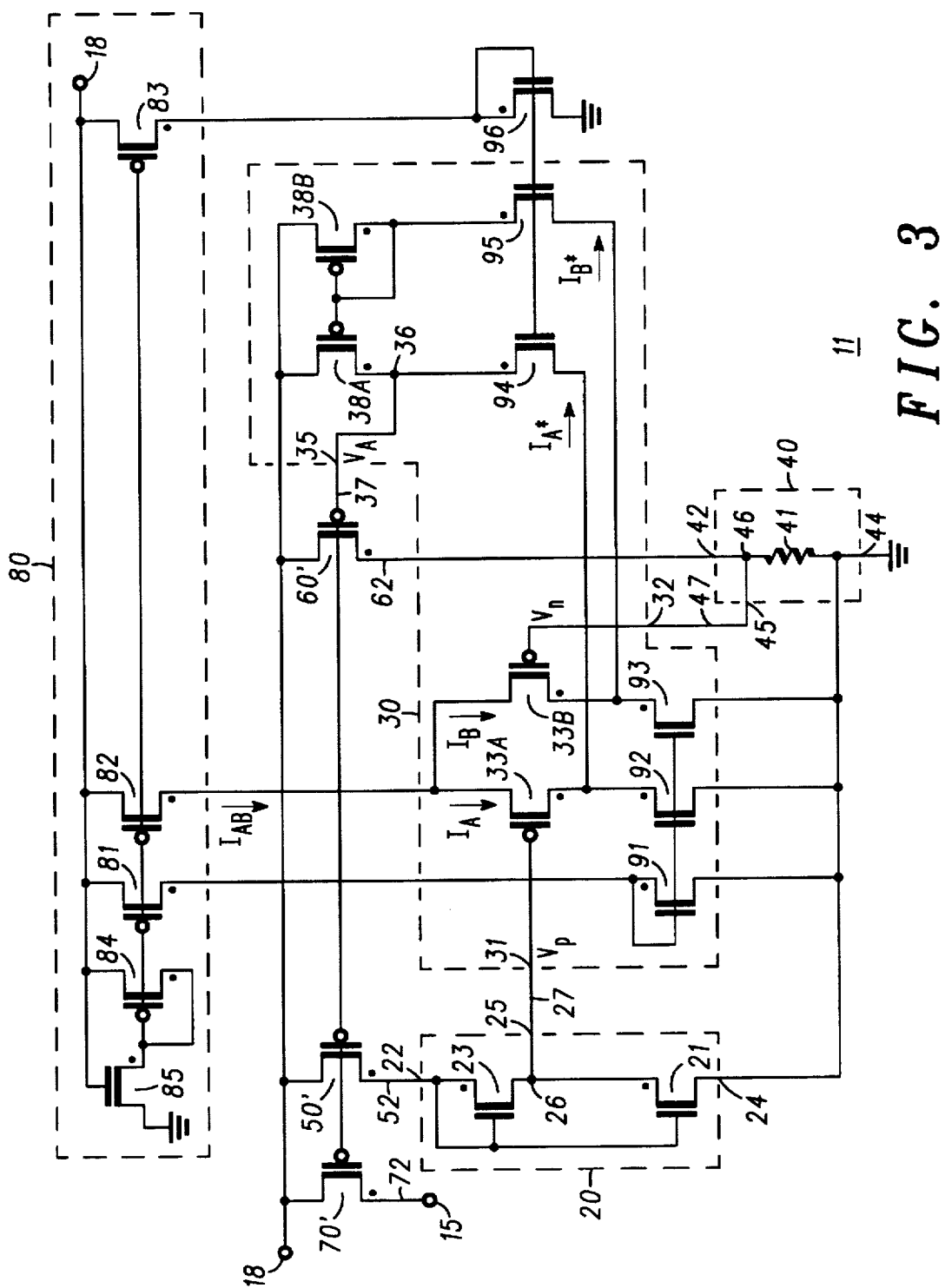
FIG. 3 shows a simplified circuit diagram of the bias generator of FIG. 2 incorporating further detail.

The elements and the function of bias generator 11 will now be explained in connection with FIG. 3. FIG. 3 shows a simplified circuit diagram of bias generator 11 with more details. Reference numbers of FIG. 2 are also applicable for FIG. 3.

Bias generator 11 comprises field effect transistors (FET) of different channel types. In FIG. 3, n-channel transistors are illustrated as shown, for example, by transistor 21. The p-channel transistors are illustrated as shown, for example, by transistors 38A, 38B.

Current sources 50, 60, 70 are implemented as p-channel transistors 50', 60', 70' coupled at the source to power supply voltage $V_{DD}$.

Measurement unit 20 (enclosed by a dashed line) comprises n-transistors 23 and 21. The drain of transistor 23 is coupled via input 22 to the drain of transistor 50'. The source of transistor 23 is coupled via node 26 to the drain of transistor 21. The source of transistor 21 is output 24 and grounded. The gates of transistors 21, 23 are also coupled to input 22.

Measurement signal 27 ($V_p$) is available at node 26 which is coupled to output 25. Element 40 (dashed line) comprises resistor 41 which is coupled to ground (output 44) and coupled via node 46 and input 42 to the drain of transistor 60'. Reference signal 47 ($V_n$) is available at node 46 which is coupled to output 45.

Differential amplifier 30 (enclosed by a dashed line) comprises p-channel transistors 33A, 33B, 38A, 38B, and n-channel transistors 91, 92, 93, 94, 95, 96. The gate of transistor 33A is non-inverting input 31 and is coupled to output 25 of measurement unit 20. The gate of transistor 33B is inverting input 32 and coupled to output 45 of element 40.

Transistors 33A, 33B form a differential pair with common sources coupled to $V_{DD}$ via transistor 82. The drains are coupled to ground via transistor 92, 93. Transistor 91 and 81 are serially arranged between $V_{DD}$ and ground. The drain of transistor 81 and the drain of transistor 91 are coupled to the gates of transistors 91, 92, 93.

Transistors 38A, 38B form a current mirror. The sources of transistor 38A, 38B are coupled to $V_{DD}$. The drain of transistor 38A is coupled via node 36 and the drain-source-path of transistor 94 to the drain of transistor 33A. The drain of transistor 38B is coupled via the drain-source-path of transistor 95 to the drain of transistor 33B. The common gates of transistor 38A, 38B are coupled to the-drain of transistor 38B. Transistor 96 and 83 are serially arranged between $V_{DD}$ and ground. The drain of transistor 83 and the drain of transistor 96 are coupled to the gates of transistors 94, 95, 96.

The gates of transistors 50', 60', and 70' are control inputs 51, 61, 71 and coupled to node 36. Node 36 has the function of output 35. The drain of transistor 70' is coupled to terminal 15. Transistors 81, 82, 83, 84 and 85 compose start-up-circuit 80 (dashed line).

The tail current $I_{AB}$ of the differential pair of transistors 33A and 33B is kept constant by transistors 82, 81, 92, 93, and 91. $I_{AB}$ is divided into the branch currents $I_A$ and $I_B$ which are equal for $V_p = V_n$. The branch currents $I_A$ and $I_B$ are partly supplied as $I_A^*$ and $I_B^*$ to current mirror transistors 38A, 38B.

The auxiliary currents generated by variable transistors 50', 60', 70' are referred to as $I_1$, $I_2$, and $I_{BIAS}$ and indicated by reference numbers 52, 62, and 72, respectively.

Measurement signal 27 ($V_p$) is available at output 25 of measurement circuit 20. It is the input voltage $V_p$ of differential amplifier 30 at non-inverting input 31 (gate of transistor 33A). Reference signal 47 ($V_n$) is available output 45. That is the voltage across resistor 41 which is the input voltage $V_n$ at inverting input 32.

Control signal 37 ($V_A$) is the output voltage $V_A$ of the differential amplifier 30 and is available at node 36 which is connected to output 35.

Variable current sources 50, 60 (transistors 50', 60') provide the currents $I_1$ and $I_2$. These currents are referred to as auxiliary currents $I_1$, $I_2$. Auxiliary currents $I_1$, $I_2$ are substantially equal, so that $I_1=I_2=I$. Differential amplifier 30 controls variable current sources 50, 60, 70 via control inputs 51, 61, 71. Variable current source 70 supplies bias current $I_{BIAS}$ in a fixed ratio to I: $I_{BIAS}=I^*\alpha$, with $\alpha$ as a scale factor.

Auxiliary currents $I_1$, $I_2$ are supplied to measurement unit 20 and element 40 where measurement signal 27 and reference signal 47 ($V_p$ and $V_n$) are derived. Transistors 21, 23 of measurement unit 20 are sensitive to temperature changes. Voltage $V_p$ is proportional to the transconductance $G_m$ of transistor 21, 23.

On the other hand, resistor 41 of element 40 is insensitive to temperature changes. The constant transconductance $G_m$ of resistor 41, that means $1/R_1$ is represented by the voltage $V_n$. Both voltages $V_p$ and $V_n$ are supplied to differential amplifier 30 whose output voltage $V_A$ controls current sources 50, 60, 70.

Voltage $V_p$ at non-inverting input 31 equals:

$$V_1 = k_1 * (V_g - V_{th}). \tag{1}$$

$V_g$ is the gate voltage of transistors 21, 23. $V_{th}$ is the threshold voltage, and $k_1$ is a coefficient depending on the geometry ratio between transistor 21 and 23. Assuming equal channel width of transistors 21, 23, and assuming that transistors 21, 23 operate in the saturated region, auxiliary current $I_1$ through the drains of 21, 23 is calculated as:

$$I = I_1 = k_2 * (V_g - V_{th})^2. \tag{2}$$

The coefficient $k_2$ depends on manufacturing process parameters and on the temperature. The transconductance is defined as $G_m = 2 * k_2 * (V_g - V_{th})$. Therefore, the current I is:

$$I = G_m * (V_g - V_{th})/2. \quad (3)$$

Voltage $V_n$ at inverting input 32 is the voltage over resistor 41:

$$V_n = I * R_1 \text{ or } I = V_n/R_1. \quad (4)$$

By substituting I of equation (3) into equation (4), $V_n$ can be calculated as:

$$V_n = R_1 * G_m * (V_g - V_{th})/2. \quad (5)$$

In the equilibrium state, the voltages $V_p$ and $V_n$ are equal. Equation (1) becomes the left side of (5), thereby giving:

$$k_1 * (V_g - V_{th}) = R_1 * G_m * (V_g - V_{th})/2, \text{ and} \quad (6)$$

$$G_m = k_1 * 2/R_1 \quad (7)$$

The coefficient $k_1$ depends only on the geometry ratio of transistor 21 and transistor 23 and does not depend on the temperature or on manufacturing parameters.

Suppose, the temperature T is rising. The transconductance $G_m$ of transistor 21, 23 of measurement unit decreases. The voltage $V_p$ (measurement signal 27) at non-inverting input 31 (gate of transistor 33A) decreases too. The voltage $V_n$ at the inverting input 32 (gate of transistor 33B) is generated by resistor 41 and remains constant. The gate-source voltage $V_{GS}$ of p-channel transistor 33A gets more negative and the branch current $I_A$ through the source-drain path of transistor 33A increases, and $I_B$ decreases. Part of the currents $I_A$ and $I_B$ is fed as $I_A*$, $I_B*$ to the current mirror of transistor 38A, 38B and the control signal 37 at output 35 is changing. A change of control signal 37 causes a change of auxiliary currents $I_1$, $I_2$ and of bias current $I_{BIAS}$ at terminal 15.

Figure 4:
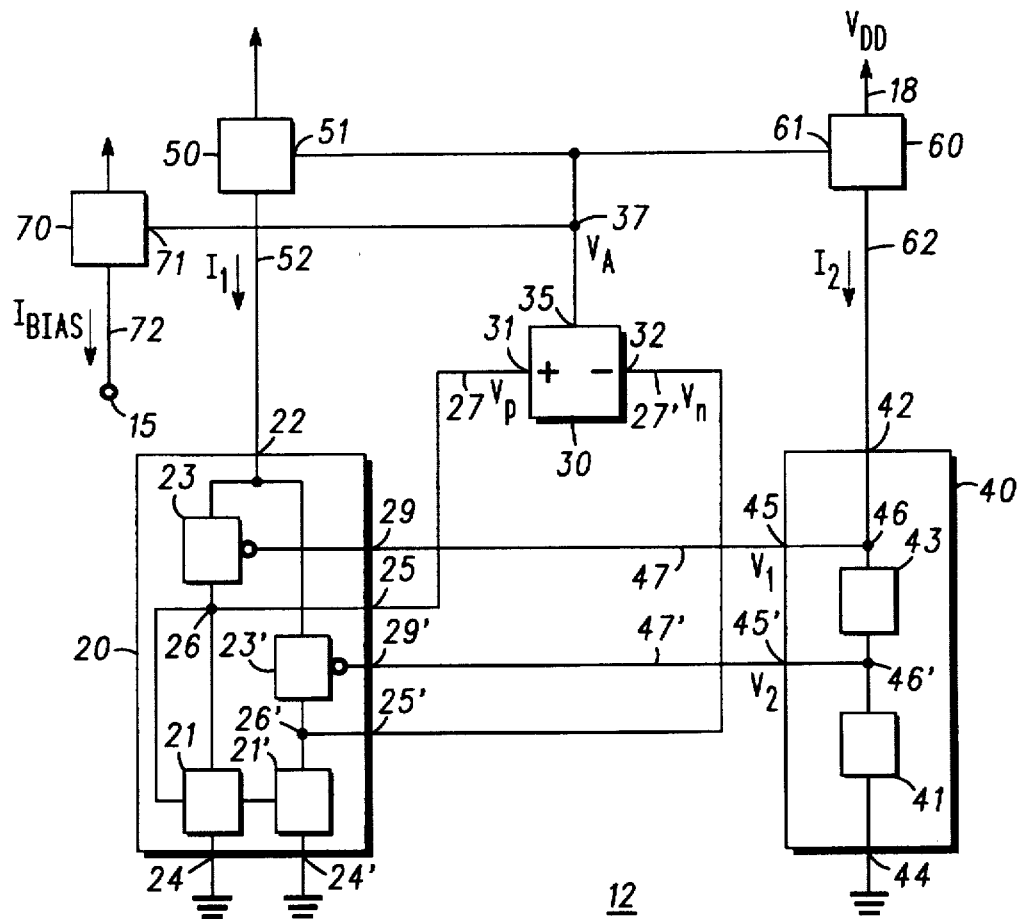
FIG. 4 shows a simplified schematic diagram of a bias generator according to a second preferred embodiment of the present invention.

FIG. 4 shows a simplified schematic diagram of bias generator 12 according to the second preferred embodiment of the present invention. In FIG. 2 and FIG. 4, the reference numbers 15, 18, 22, 24, 30, 31, 32, 35, 37, 42, 44, 50, 51, 52, 60, 61, 62, 70, 71, 72 stand for the same components or signals.

In FIG. 2 and FIG. 4, the reference numbers 20, 25, 27, 40, 47 stand for analogous components or signals. However, their operation or function is different as a consequence of the embodiment which will be explained in more detail by referring to FIG. 4.

In bias generator 12, variable current sources 50, 60, 70 and differential amplifier 30 are as in bias generator 11. Measurement unit 20, element 40 as well as the wiring to differential amplifier 30 are different.

Measurement unit 20 comprises p-channel transistors 23, 23' and n-channel transistors 21, 21'. Transistors 23, 21 are serially arranged with their drain-source (D-S) paths between input 22, node 26 and output 24. Transistors 23', 21' are serially arranged with their D-S paths between input 22, node 26' and output 24'. The gates of transistors 21, 21' are coupled to node 26. The gates of transistors 23, 23' are coupled to input 29 and input 29', respectively, for receiving reference signals 47, 47' ($V_1$, $V_2$). Nodes 26, 26' are coupled to outputs 25, 25' for providing measurement signals 27, 27' ($V_p$, $V_n$).

Element 40 comprises resistors $R_1$, $R_2$ (43, 41) which are serially arranged between input 42 and output 44 via nodes 46, 46'. Nodes 46, 46' are coupled to outputs 45, 45' for providing the above mentioned reference signals 47, 47' ($V_1$, $V_2$).

Outputs 25, 25' of measurement unit 20 are coupled to non-inverting input 31 and inverting input 32 of differential amplifier 30, respectively. Outputs 45, 45' of element 40 are coupled to inputs 29, 29' of measurement unit 20, respectively. The other elements are wired as in bias generator 11.

As in bias generator 11, variable current source 50, 60, 70 generate auxiliary currents $I_1$ (52), $I_2$ (62) and bias current $I_{BIAS}$ (72) respectively.

Reference signals 47, 47' are the constant voltages $V_1$, $V_2$ maintained by the voltage divider of resistor 43, 41. $V_1$, $V_2$ are related to auxiliary current $I_2$ by: $V_1 = I_2 * (R_1 + R_2)$, $V_2 = I_2 * R_2$. Resistor $R_2$ can have the value zero.

$V_1$, $V_2$ provide constant bias for transistors 23, 23' in measurement unit 20.

Measurement signals 27, 27' depend on the transconductance of transistors 23, 23', 21, 21' and on auxiliary current $I_1$. Measurement signals 27, 27' are the voltages $V_p$, $V_n$ at non-inverting input 31 and inverting input 32 of differential amplifier 30.

Temperature changes lead to a transconductance change in measurement unit 20. Measurement signals 27, 27' control differential amplifier 30. As in bias generator 11, control signal 37 ($V_A$) acts on variable current sources 50, 60, 70 which change auxiliary currents $I_1$, $I_2$ (52, 62) and bias current $I_{BIAS}$ (72).

In comparison to bias generator 11 (FIG. 2, 3), bias generator 12 is implemented more differentially. It has therefore a better immunity against spikes.

Bias generator 12 does not rely on a quadratic I/V-transfer function for field effect transistors as in equation (b 2). It can be implemented by a broader range of processes, such as, for example, GCMOS, short-channel MOSFET, and others.

Figure 5:
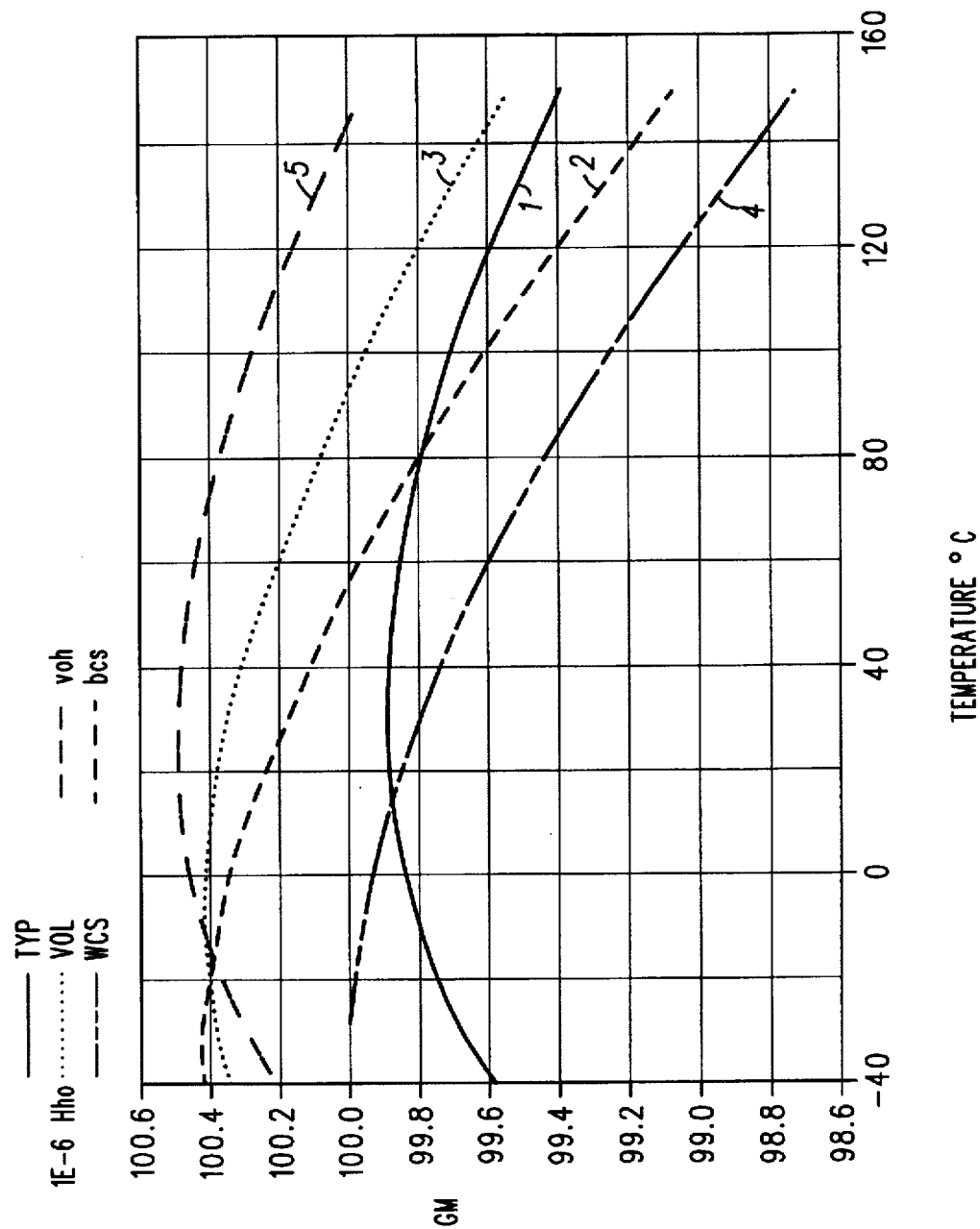
FIG. 5 shows a transconductance-temperature-diagram obtained by simulation.

The properties of bias generator 11 have been estimated by a simulation, e.g. SPICE or equivalent. FIG. 5 is a diagram showing the simulated relation $G_m = f(T)$ between transconductance $G_m$ and absolute temperature T. The transconductance $G_m$ is given on the vertical axis in Mho. The temperature T in a range from $-40°$ C. to $160°$ C. is given on he horizontal axis. The graphs 1 to 5 show the following:

Graph 1 (typ) shows a typical average relation under average conditions;

Graph 2 (vol) indicates that best speed n-channel transistors and worst speed p-channel transistors are used;

Graph 3 (voh) indicates that best speed p-channel transistors and worst case n-channel transistors are used;

Graph 4 (wcs) indicates the worst case speed, that is the lowest possible speed of the main circuit; and Graph 5 (bcs) indicates the best case speed, that is the highest possible speed of the main circuit.

As the simulation shows, the transconductance variation can become less than 2% (graph 1) for a temperature range from $-40°$ C. to $160°$ C.

Figure 6:
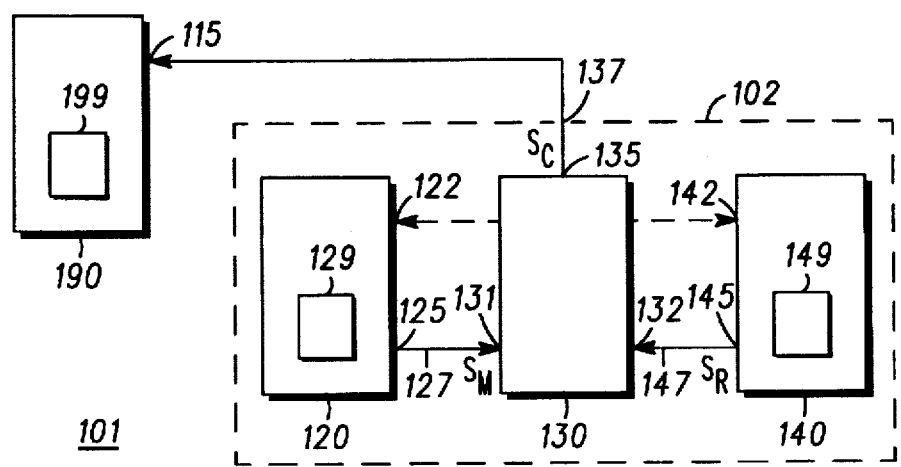
FIG. 6 shows a simplified schematic diagram of an electronic circuit introducing larger functional blocks for generalizing the present invention.

As a further generalization of the invention, FIG. 6 shows a simplified schematic diagram of an electronic circuit 101. It comprises functional circuit 190, measurement circuit 120, reference circuit 140, and control circuit 130.

Functional circuit 190 can be any analog or digital circuit for which transconductance stabilization is required. Functional circuit 190 comprises element 199 which has a transconductance affected by thermal drift. Functional circuit has input 115 for receiving a control signal $S_C$ (137).

Measurement circuit 120 comprises element 129 having a transconductance which is affected in the same way as element 199 in functional circuit 190. Measurement circuit 120 has output 125 for supplying measurement signal $S_M$ (127).

Reference circuit 140 comprises element 149 which is not influenced by temperature changes. Reference circuit 140 has output 145 for supplying a stable reference signal $S_R$ (147) which does not depend significantly on the temperature.

Control circuit 130 has inputs 131, 132 for receiving $S_M$ and $S_R$, respectively. Control circuit 130 has output 135 for supplying mentioned control signal $S_C$.

As shown in FIG. 6, functional circuit 190 is at input 115 coupled to output 135 of control circuit 130. Measurement circuit 120 is coupled at output 125 to input 131 of control circuit 130. Reference circuit 140 is coupled at output 145 to input 132 of control circuit 130. There are optional connections shown dashed between control circuit 130 and inputs 122, 142 of measurement circuit and reference circuit 140, respectively.

Temperature changes act on functional circuit 190 and on measurement circuit 120. Element 129 of measurement circuit 120 has the same or a similar structure as element 199 of functional circuit 190. Temperature changes in both elements lead to proportional transconductance changes. Element 129 is used as a sensor to generate measurement signal $S_M$. The influence of temperature changes on element 149 of reference circuit 140 can be neglected. Therefore, element 149 is used to provide reference signal $S_R$. In control circuit 130, both signals are compared and a control signal $S_C$ is generated. $S_C$ is then supplied to functional circuit, and, optionally, to measurement circuit 120 and reference circuit 140.

Measurement circuit 120, control circuit 130, and reference circuit 140 act as control loop 102 for functional circuit 190. It is particular that no direct measurement is performed in the functional circuit 190 itself. Instead, the behavior of functional circuit 190 is simulated in measurement circuit 120 and $S_M$ is derived from there.

It will be appreciated that although only one particular embodiment of the invention has been described in detail, various modifications and improvements can be made by a person skilled in the art based on the teachings herein without departing from the scope of the present invention.

We claim:

1. An apparatus having a bias generator for neutralizing thermal drift in a main circuit by supplying a bias current to said main circuit, characterized in that it comprises:

a first and a second variable current source for providing first and second auxiliary currents, respectively;

a third variable current source for providing the bias current;

an output terminal coupled to said third variable current source, said output terminal being provided for coupling the main circuit to said bias generator;

a differential amplifier for supplying a control signal to said first, second and third variable current sources;

a measurement unit being coupled to a first input of said differential amplifier for supplying a measurement signal, said measurement unit being coupled to said first variable current source and conducting the first auxiliary current to a reference potential; and a substantially temperature invariant element being coupled to a second input of said differential amplifier for providing a reference signal, said element being coupled to said second variable current source.

2. The apparatus of claim 1 where the auxiliary currents generated by said first and second variable current sources are substantial equal.

3. The apparatus of claim 1 where said first and second, and third variable current sources and said differential amplifier are located on a monolithic integrated circuit and said element is partially or fully external to said integrated circuit.

4. The apparatus of claim 1 where said first, second, and third variable current sources are implemented by FETs each having a gate as a control input.

5. The apparatus of claim 1 where said differential amplifier comprises FETs which form a differential pair and a current mirror.

6. The apparatus of claim 1 where said measurement unit comprises a first and a second FET which are serially arranged with their drain-source paths between said first variable current source and said reference potential, and where the measurement signal is available at a node between said FET.

7. An apparatus having a bias generator for neutralizing thermal drift in a main circuit by supplying a bias current to said main circuit, characterized in that it comprises:

a first and a second variable current source for providing first and second auxiliary currents, respectively;

a third variable current source for providing the bias current;

an output terminal coupled to said third variable current source, said output terminal being provided for coupling the main circuit to said bias generator;

a differential amplifier for supplying a control signal to said first, second and third variable current sources;

a measurement unit being coupled to the non-inverting input and to the inverting input of said differential amplifier for supplying a first and a second measurement signal, said measurement unit being coupled to said first variable current source; and a substantially temperature invariant element being coupled to said measurement unit for providing a first and a second reference signal, said element being coupled to said second variable current source.

8. The apparatus of claim 7 where the auxiliary currents generated by said first and second variable current sources are substantial equal.

9. The apparatus of claim 7 where said first, second, and third variable current sources and said differential amplifier are located on a monolithic integrated circuit and said element comprises components which are located externally to said integrated circuit.

10. The apparatus of claim 7 where said first, second, and third variable current sources are implemented by FETs each having a gate as a control input.

11. The apparatus of claim 7 where said measurement unit comprises:

a first and a second FET which are serially arranged with their drain-source paths between said first variable current source and ground, and where the first measurement signal is available at a first node between said first and second FETs; and a third and fourth FET which are serially arranged with their drain-source paths between said first variable current source and ground, and where the second measurement signal is available at a second node between said third and fourth FETs.

12. The apparatus of claim 7 where said temperature invariant element comprises:

a first and a second resistor which are serially arranged between said second variable current source and ground, and where the first and second reference signal are available at a nodes at said resistors.

* * * * *